United States Patent [19]

Lish

[11] Patent Number: 5,361,041
[45] Date of Patent: Nov. 1, 1994

[54] PUSH-PULL AMPLIFIER

[75] Inventor: Charles A. Lish, Nashua, N.H.

[73] Assignee: Unitrode Corporation, Billerica, Mass.

[21] Appl. No.: 79,336

[22] Filed: Jun. 17, 1993

[51] Int. Cl.⁵ .......................... H03F 3/45; H03F 3/30
[52] U.S. Cl. .................................. 330/255; 330/269; 330/270; 330/274
[58] Field of Search ............. 330/255, 264, 267, 268, 330/269, 270, 273, 274

[56] References Cited

U.S. PATENT DOCUMENTS

| 4,442,409 | 4/1984 | Preslar | 330/274 |
| 4,471,322 | 9/1984 | Yamaguchi et al. | 330/267 |
| 4,480,230 | 10/1984 | Brehmer et al. | 330/255 |
| 4,800,339 | 1/1989 | Tanimoto et al. | 330/253 |
| 5,166,636 | 11/1992 | Bien | 330/255 |

FOREIGN PATENT DOCUMENTS

| 0023545 | 3/1978 | Japan | 330/264 |

OTHER PUBLICATIONS

Large Swing CMOS Power Amplifier, Brehmer, K. E. IEEE Journal of Solid-State Circuits, vol. sc-18, No. 6, Dec., 1983, pp. 624-629.
A Programmable CMOS Dual Channel Interface Processor for Telecommunications Applications, Ahuja, Bhupendra IEEE Journal of Solid-State Circuits, vol. SC-19, No. 6, Dec., 1984, pp. 892-899.
A Head Actuator Driver IC for Hard-Disk Drives, Uenten, P., ISSCC 93/Session 13/Hard Disk and Tape Drives/Paper FA 13.6, Feb. 26, 1993, pp. 222, 223, 292.
"V-FET Amplifier", Elector, Jul./Aug. 1980, pp. 7-10, 7-11.

Primary Examiner—James B. Mullins
Attorney, Agent, or Firm—Weingarten, Schurgin, Gagnebin & Hayes

[57] ABSTRACT

An improved push-pull amplifier having a driver circuit for driving a source follower output transistor. The driver circuit includes a replicating transistor having electrical characteristics substantially similar to those of the source follower transistor, a buffer amplifier, and a circuit, coupled to the replicating transistor and the buffer amplifier, for summing the voltage across the replicating transistor and the buffer output signal to provide a gate signal to the source follower output transistor. A cross current feedback circuit regulates the quiescent current flow through the output transistors by adjusting the gate signal provided to the upper, source follower output transistor in response to a sensed current flow through the lower output transistor.

18 Claims, 6 Drawing Sheets

PUSH-PULL AMPLIFIER

FIELD OF THE INVENTION

This invention relates generally to amplifier circuits and more particularly, to a push-pull amplifier circuit having a pair of NMOS output transistors with an improved driver and a cross current circuit for regulating the quiescent current.

BACKGROUND OF THE INVENTION

As is known in the art, push-pull amplifier circuits generally include an output stage comprising a pair of output transistors, such as bipolar or Metal Oxide Semiconductor (MOS) transistors, each of which conducts current for a predetermined duration of an excitation cycle. With this arrangement, current is either sourced or sunk by the amplifier output stage depending on the conduction state of the output transistors. The pair of output transistors are complimentary in that one is a p-type transistor (i.e., a pnp or a PMOS device) and the other is an n-type transistor (i.e., an npn or an NMOS device) and the amplifier output signal is provided at the interconnection thereof. For example, when the upper output transistor (i.e., that transistor coupled to a positive supply voltage) is an npn device and the lower output transistor (i.e., that transistor coupled to a negative supply voltage or to ground) is a pnp device, then a push-pull emitter follower amplifier is provided; whereas, when the upper output transistor is a pnp device and the lower output transistor is an npn device, then a common emitter push-pull amplifier is provided.

Amplifier circuits are often categorized by the duration of a sinusoidal excitation, or AC cycle, during which each of the pair of output transistors conducts. For example, in a Class B push-pull amplifier, each of the output transistors conducts for one-half of an AC cycle; whereas, each output transistor of a Class AB push-pull amplifier conducts for more than one-half of a cycle but less than a full cycle.

As is also known, Class B push-pull amplifiers are sometimes susceptible to crossover distortion, a phenomena in which there is a deadband period after one of the pair of output transistors conducts and before the other conducts, during which neither of the output transistors conducts. Stated differently, during the deadband time, the amplifier output stage neither sources nor sinks current. This situation is undesirable since it results in open-loop operation, thereby potentially leading to output oscillations.

One technique for reducing the tendency toward crossover distortion is to provide a quiescent current through each of the pair of output transistors of sufficient magnitude to maintain a forward bias on the gate to source (or base to emitter) diode. Stated differently, this technique requires selecting the quiescent operating point to be slightly above the threshold (or cutoff) point. In this way, the Class B push-pull amplifier essentially operates as a Class AB type amplifier since each output transistor conducts for greater than one-half cycle. With such an arrangement, it is desirable that the quiescent current be relatively accurately controlled since, if the quiescent current is too high, unnecessary power loss may result; whereas, if such current is too low, undesirable crossover distortion, or deadband operation, may result.

One technique for establishing a suitable quiescent current in the case of an emitter-follower push-pull amplifier is shown in FIG. 1. Diodes D1, D2 establish the requisite bias at the base electrodes of transistors Q1, Q2, respectively, in order to forward bias the base to emitter diodes thereof. Preferably, diodes D1, D2 have like characteristics to the base to emitter diodes of the corresponding one of output transistors Q1, Q2, respectively. The current through diodes D1, D2 is controlled by current source I1, to forward bias the diodes D1, D2. In the case where the emitter-follower arrangement of FIG. 1 provides the output stage of a push-pull amplifier, I1 represents a conventional current source, such as is often provided by a current mirror arrangement, and $V_{i}g_m$ represents a voltage controlled current source where $g_m$ is the transconductance of the preceding amplifier stage (not shown). The current flowing through the series connected complimentary output transistors Q1, Q2 is a "mirrored" version of the controlled, forward-biased current flow through diodes D1, D2. With this arrangement, the base-emitter diodes of the output transistors Q1, Q2 remain forward biased, even under light, or no-load operating conditions.

As is also known, in certain applications, CMOS integrated circuit fabrication is preferable to bipolar technology. For example, mixed signal LSI requires a high degree of functionality and thus benefits from the high integration density of CMOS as opposed to bipolar techniques.

SUMMARY OF THE INVENTION

In accordance with the invention, an amplifier circuit has an input differential amplifier stage, for providing an intermediate amplified signal in response to an input signal, and an output stage comprising a pair of NMOS output transistors, with the upper output transistor arranged as a source follower. More particularly, each of the pair of output transistors has a drain electrode, a gate electrode, and a source electrode, with the source electrode of the upper one of the pair of transistors coupled to the drain electrode of a lower one of the pair of transistors and an amplifier output signal provided at such interconnection. A driver stage, coupled between the input differential amplifier stage and the output stage, comprises a first driver portion having a first drive transistor for providing a gate signal to the gate electrode of the upper output transistor and a second driver portion having a second drive transistor for providing a gate signal to the gate electrode of the lower output transistor. Each of the first and second driver portions includes a replicating device having electrical characteristics substantially similar to those of the corresponding one of the output transistors, wherein the gate signals are related to the voltage across the corresponding replicating device. More specifically, the replicating device of the first driver portion is coupled to the intermediate amplified signal. Each of the driver portions further comprises a buffer amplifier providing a buffer output signal and a circuit for summing the voltage across the replicating device with the buffer output signal to generate the gate signal.

With this arrangement, a push-pull amplifier circuit is provided with a pair of NMOS output transistors. This arrangement is desirable since NMOS devices generally require less chip, or die area than PMOS devices. Moreover, the source-follower arrangement of the upper output transistor provides a frequency response having relatively high frequency poles, thereby potentially improving operational stability. The replicating devices establish a desired quiescent current flow through the pair of output transistors in order to maintain the gate to source diodes thereof in a forward biased condition, and thus, to reduce the tendency toward deadband operation during light, or no-load conditions. More particularly, by coupling the replicating device of the first driver portion to the intermediate amplified signal, such first replicating device is "floated". The buffer amplifiers provide suitable gate voltage for driving the NMOS output transistors in the triode region of operation (i.e., that region of operation in which the drain to source voltage is less than the pinchoff voltage). By summing the bias provided by the replicating device with the buffer amplifier output signal, the technique of replicating the diode of a transistor to establish a forward biasing quiescent current is adapted for driving the NMOS output transistors in the triode region.

In accordance with a further aspect of the invention, an amplifier is provided with a cross current feedback circuit. The amplifier is substantially as described above with the first driver portion having a first drive transistor for providing a gate signal to the gate electrode of the upper NMOS output transistor and the second driver portion having a second drive transistor for providing a gate signal to the gate electrode of the lower NMOS output transistor. The cross current circuit regulates the quiescent current flow through the pair of output transistors and includes a sensor for sensing the current flow through the lower output transistor and a circuit, coupled to the first drive transistor, for adjusting the gate signal provided by the first driver portion in response to the sensed current flow. Each of the first and second driver portions includes a replicating device having electrical characteristics substantially similar to those of the corresponding one of the output transistors wherein the gate signals are related to the voltage across the corresponding one of the replicating devices, as previously described.

With this arrangement, an amplifier having improved control over quiescent operation is provided. That is, the replicating devices establish the quiescent current, or more particularly, coarsely set such current. The quiescent current is finely controlled or regulated by the cross current feedback circuit which senses the current through the lower output transistor and adjusts the gate signal provided to the upper output transistor accordingly. In this way, if excessive quiescent current flows through the lower output transistor, the gate signal to the upper output transistor is decreased accordingly, so that less current flows through the upper output transistor to the lower output transistor. However, if the desired quiescent current is sensed through the lower output transistor or if the source of excessive current flow through the lower output transistor is external, the gate signal provided to the upper output transistor is essentially unaffected by the cross current circuit. Moreover, since the circuit for adjusting the gate signal is coupled to the first drive transistor (i.e., rather than being fed back to an input of the first driver portion, for example), the frequency response of the amplifier is not degraded by use of the cross current feedback circuit.

BRIEF DESCRIPTION OF THE DRAWINGS

The foregoing features of this invention, as well as the invention itself, may be more fully understood from the following detailed description of the drawings in which.

DESCRIPTION OF THE PREFERRED EMBODIMENT

Figure 2:
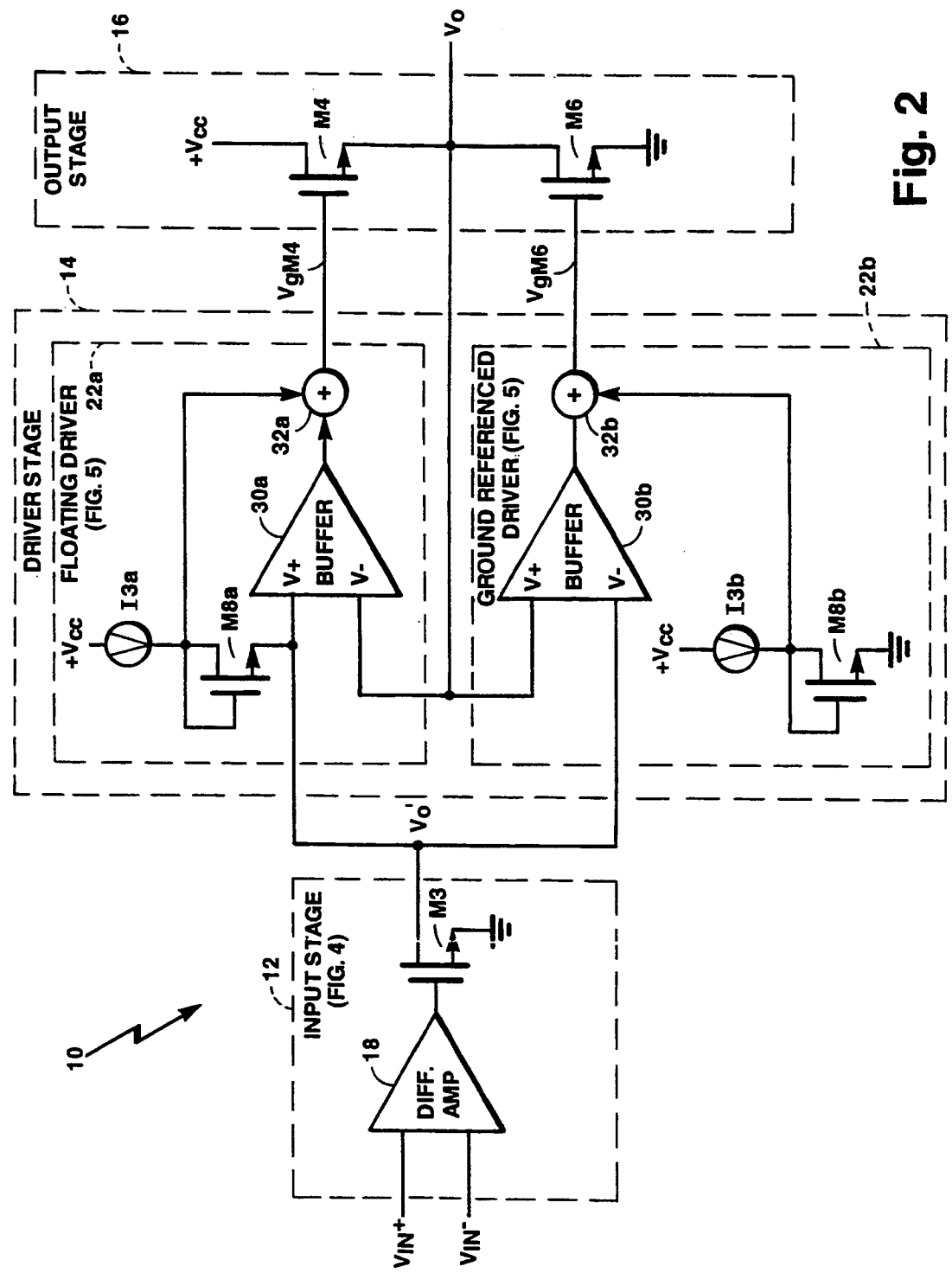
FIG. 2 is a block diagram of an improved amplifier circuit in accordance with the invention.

Referring now to FIG. 2, an improved push-pull amplifier circuit 10 includes an input stage 12, a driver stage 14, and an output stage 16. The input stage 12 includes a conventional differential amplifier 18 and a gain stage, here represented by transistor M3, as will be described in greater detail in conjunction with FIG. 4. The differential amplifier 18 is fed by a pair of input signals $V_{IN+}$, $V_{IN-}$, but may alternatively be single ended with one of the inputs coupled to ground. Input stage 12 provides an output signal referred to hereinafter as an intermediate amplified signal $V_o'$.

Output stage 16 includes a pair of NMOS output transistors M4, M6, with the output signal $V_o$ of amplifier 10 provided at the source electrode of source-follower output transistor M4. That is, the source electrode of the first, upper NMOS output transistor M4 is coupled to the drain electrode of a second, lower NMOS output transistor M6 and the output signal $V_o$ is provided at the interconnection thereof, as shown. Thus, it is apparent that here, the pair of output transistors M4, M6 is not a conventional complimentary transistor pair, but rather is comprised of a pair of like NMOS devices M4, M6. As noted above, NMOS devices are preferable to PMOS devices due to their increased area efficiency. Moreover, the source-follower arrangement of output transistor M4 is desirable since it is characterized by relatively high frequency poles, thereby potentially improving operational stability. It is noted that the transistor described herein as the upper output transistor M4 is characterized as being coupled to a positive supply voltage $+V_{CC}$, here of +15 volts; whereas, the lower output transistor M6 is coupled, or referenced to ground.

Figure 5:
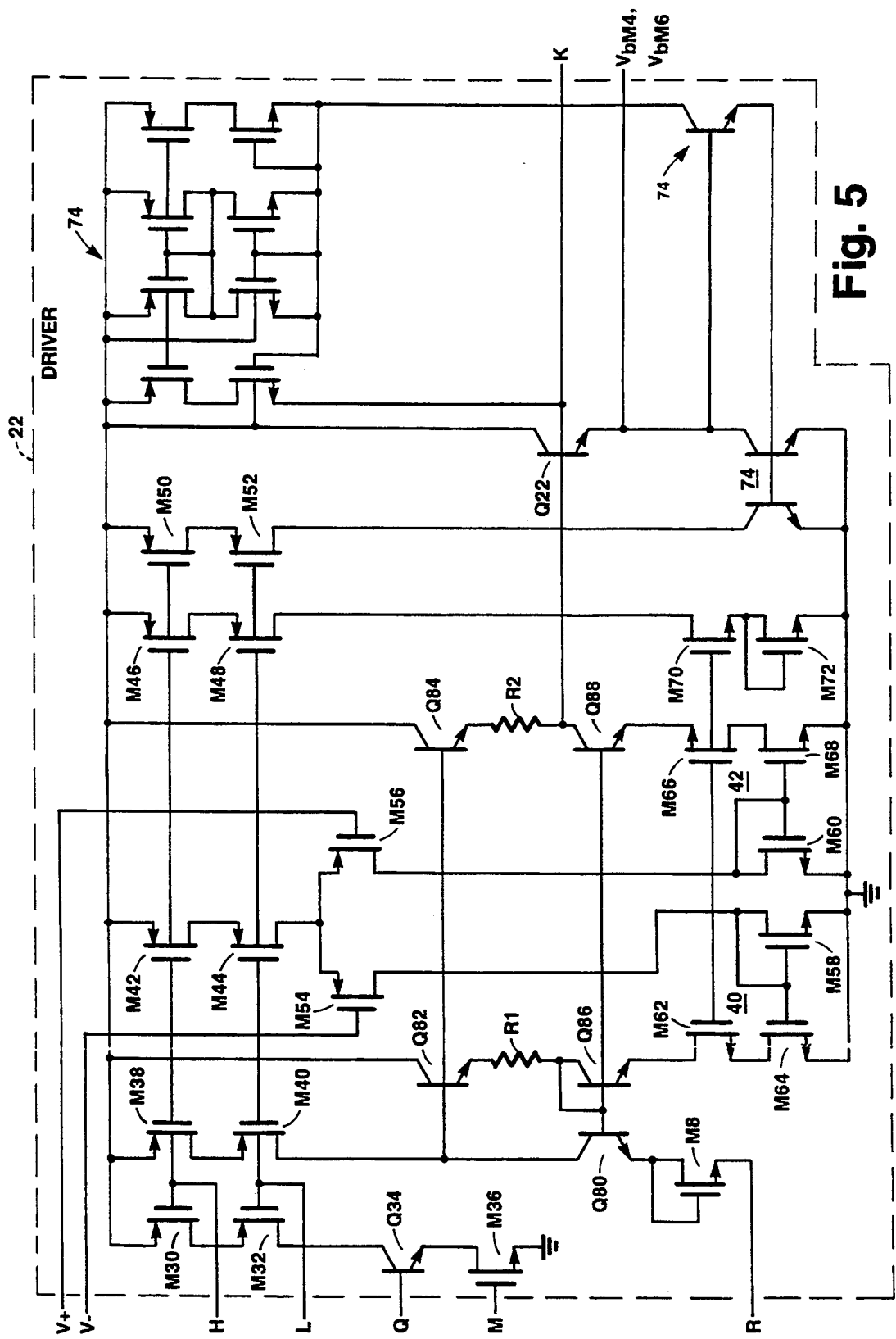
FIG. 5 is a detailed schematic of the driver stage of the amplifier circuit of FIG. 3.

Driver stage 14 is coupled between the input stage 12 and the output stage 16 and includes a first driver portion 22a, referred to alternatively as a floating driver portion 22a, for driving the gate electrode of upper output transistor M4 and a second driver portion 22b, referred to alternatively as a ground referenced driver portion 22b, for driving the gate electrode of lower output transistor M6. More particularly, first driver portion 22a provides a gate signal $Vg_{m4}$ to the gate electrode of the upper output transistor M4; whereas, the second driver portion 22b provides a gate signal $Vg_{m6}$ to the gate electrode of the lower output transistor M6. Driver portions 22a, 22b will be described in greater detail below in conjunction with FIG. 5. However, it is noted initially that here, driver portions 22a, 22b are provided by the same, configurable driver circuit 22 of FIG. 5. That is, the driver circuit 22 of FIG. 5 is configurable to provide the floating driver 22a for driving the upper NMOS output transistor M4 or the ground referenced driver 22b for driving the lower NMOS output transistor M6 in a manner described hereinafter.

Each driver portion 22a, 22b includes a replicating device, here an NMOS transistor M8a, M8b, and a buffer amplifier 30a, 30b, respectively. Buffer amplifiers 30a, 30b have inputs V+, V− coupled to the intermediate amplified signal $V_o'$ and the amplifier output signal $V_o$, as shown. Replicating transistors M8a, M8b "replicate" the gate to source diode of the corresponding output transistor M4, M6, respectively, in that transistors M8a, M8b have electrical characteristics like, or substantially similar to, those of corresponding output transistors M4, M6. More particularly, the electrical characteristics of each of the replicating devices M8a, M8b are matched to those of the corresponding output transistors M4, M6 respectively, so that the current through the corresponding devices (i.e., M8a and M4 or M8b and M6) varies in accordance with the device width, for a given channel length. Preferably, this matching is achieved by providing the corresponding devices with like K' factors (i.e., the ratio of mobility to oxide capacitance), threshold voltages, source body effect characteristics, and other electrical characteristics. The matching of the electrical characteristics is facilitated by fabricating the amplifier 10 from a single substrate.

More particularly, transistors M8a, M8b are "diode-connected" with the drain and gate electrodes of each such transistor interconnected, as shown. Also coupled to the drain electrode of each of transistors M8a, M8b is a current source I3a, I3b, respectively, as will become apparent from the detailed discussion of FIG. 5, below. Each of driver portions 22a, 22b further includes a summing circuit 32a, 32b for summing the bias voltage across the corresponding transistor M8a, M8b with an output, or buffer signal of the corresponding one of buffer amplifiers 30a, 30b, respectively. It is noted that while replicating transistors M8a, M8b are here shown to be NMOS devices, other types of devices such as PMOS may be used.

More particularly, the difference between driver portions 22a, 22b is in the coupling of the replicating transistor M8a, M8b. That is, in driver portion 22a, transistor M8a is "floating" in the sense that it is not referenced to ground. Rather, the source electrode of transistor M8a is coupled to the intermediate amplified signal $V_o'$, as shown. In driver portion 22b, on the other hand, the source electrode of transistor M8b is coupled to ground. With this arrangement, the use of replicating transistor M8a is adapted for upper NMOS output transistor M4. Stated differently, because the source of upper output transistor M4 is floating, so too must the replicating diode M8a.

In certain applications, it is desirable to operate a push-pull amplifier 10 in a Class AB manner. That is, it is desirable that each of the output transistors M4, M6 conducts for greater than one-half of an excitation cycle in order to eliminate deadband operation, a phenomena during which neither of the output transistors M4, M6 conducts (i.e., current is neither sourced nor sunk by the output stage 16). Deadband operation can be detrimental since it renders the amplifier operation "open-loop", thereby potentially leading to output signal $V_o$ oscillations. In order to avoid deadband operation, a nominal quiescent current may be provided through the output transistors M4, M6. In this way, Class AB operation is achieved and deadband operation is avoided. Moreover, it is desirable to provide relatively accurate or fine-tuned control of the quiescent current since, if such current is too large, unnecessary power loss may result; whereas, if such current is too small, undesirable deadband operation may result.

Referring still to FIG. 2, the operation of driver stage 14 will now be discussed. It is initially noted that the replicating transistors M8a, M8b of driver portions 22a, 22b establish a quiescent current flow through the output transistors M4, M6 sufficient to forward bias the gate to source junctions thereof and the buffer amplifiers 30a, 30b provide the necessary gate voltage for deep triode region operation. More particularly, here, the output stage 16 is designed to source and/or sink approximately 250 milliamps and the desired quiescent current is between approximately 1.25 and 5.0 milliamps. Triode region operation is characterized by the drain to source voltage being less than the pinchoff voltage. In the triode region of operation, a large gate to source voltage change results in a relatively small drain to source voltage change. Thus, it is apparent that for triode operation, a relatively large gate voltage is required to achieve a relatively large output voltage $V_o$ swing.

Consider first quiescent operation of amplifier 10 (i.e., at a lightly, or no-load situation). Under such operating conditions, the output voltage $V_o$ and the intermediate amplified signal $V_o'$ are equal. Thus, the output, or buffer signals provided by the buffer amplifiers 30a, 30b are approximately zero so that the result of summing the buffer output signal with the voltage across the replicating transistor is simply the voltage across the replicating transistor. Thus, in the case of floating driver portion 22a, the gate signal $Vg_{M4}$ is equal to the voltage across M8a, or $V_o' + V_{M8a}$. Whereas, the gate signal $Vg_{M6}$ is equal to the voltage across transistor M8b, or $V_{M8b}$.

On the other hand, when the output stage 16 is either sourcing or sinking maximum current (i.e., in which case one of the output transistors M4, M6, respectively is operating in triode region assuming that the output voltage $V_o$ is near the positive rail when sourcing or the negative rail when sinking), the buffer signals provided by buffer amplifiers 30a, 30b provide the requisite gate voltage. For example, when maximum current is being sourced, $V_o'$ is greater than $V_o$. Thus, the buffer signal from buffer amplifier 30a increases (close to the positive supply voltage $+V_{CC}$, here of +15 volts); whereas the buffer signal from buffer amplifier 30b decreases (close to ground). Thus, the gate signal $Vg_{m4}$ provided to the gate electrode of transistor M4 is approximately equal to the positive supply voltage of +15 volts and the gate signal $Vg_{M6}$ provided to the gate electrode of transistor M6 is at approximately ground. In this way, the upper output transistor M4 is operated in triode region and the lower output transistor M6 does not conduct in order to source maximum output current and provide a relatively large output voltage $V_o$ swing.

Similarly, when maximum current is being sunk by the output stage 16 of amplifier 10, the buffer signal of buffer amplifier 30a decreases (close to ground) and the buffer signal of buffer amplifier 30b increases (close to the positive supply voltage of +15 volts). With this arrangement, the lower output transistor M6 is operated in triode region and the upper output transistor M4 does not conduct in order to sink maximum output current and provide a relatively large output voltage $V_o$ swing.

Figure 3:
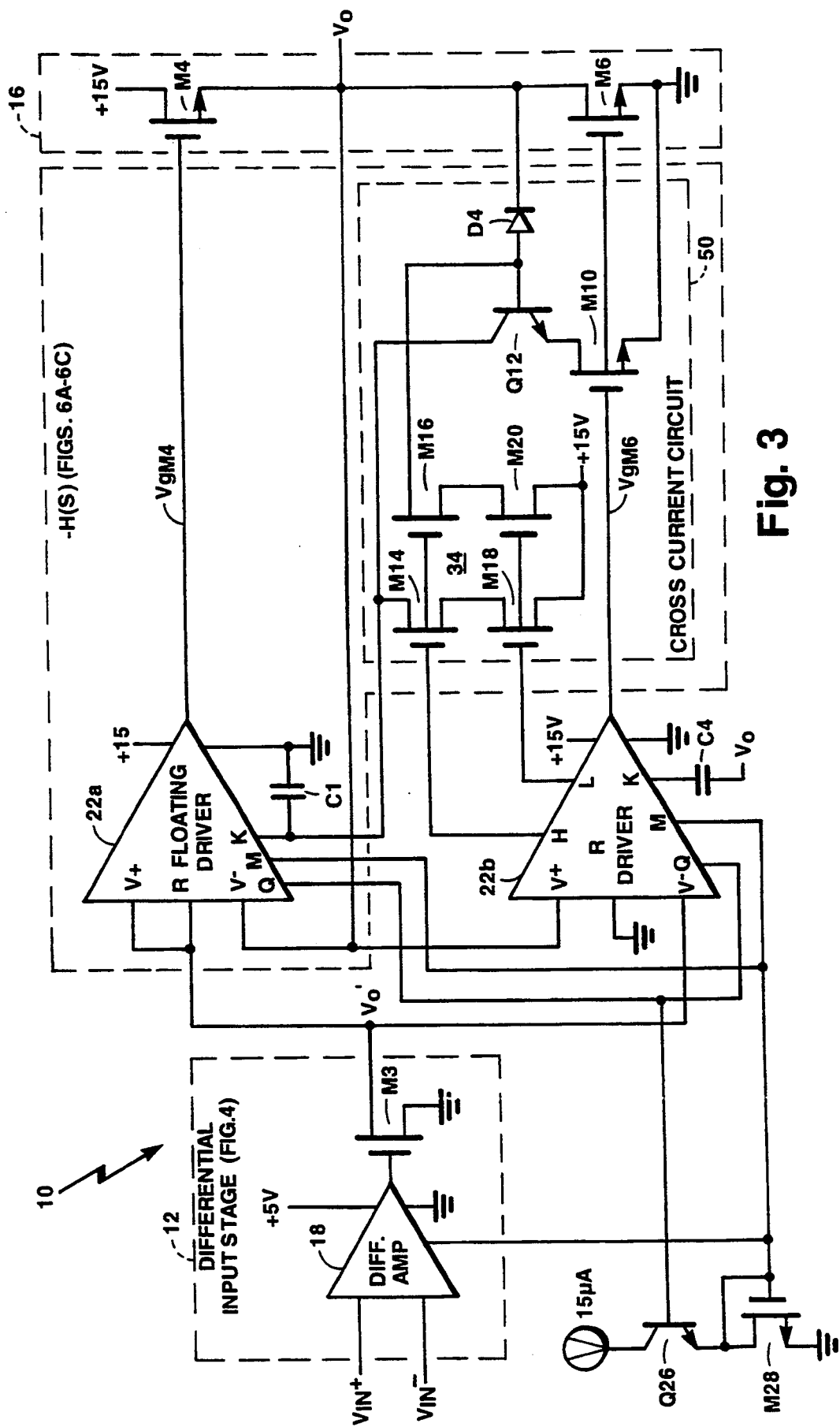
FIG. 3 is a somewhat more detailed block diagram of the improved amplifier circuit of FIG. 2.

Referring now to FIG. 3, a detailed block diagram of the amplifier 10 of FIG. 2 is shown to include the input stage 12 and the output stage 16. Here, the driver portions 22a, 22b are shown without the replicating transistors M8a, M8b, the buffer amplifiers 30a, 30b, and the summing circuits 32a, 32b separated out, respectively. Note that the driver portions 22a, 22b are shown to have several terminals labelled H, K, L, M, Q, and R in addition to inputs V+, V− (FIG. 2) and outputs providing the gate signals $Vg_{M4}$, $Vg_{M6}$ (FIG. 2), respectively. While the function of the above mentioned terminals of driver portions 22a, 22b will be described in conjunction with the configurable driver circuit 22 (FIG. 5), suffice it here to say that terminals H, L, M, and Q are coupled to bias voltages and like terminals M and Q of the driver portions 22a, 22b are interconnected, as shown in FIG. 3, in order to minimize random offsets between the gate signals $Vg_{M4}$, $Vg_{M6}$ in quiescent operation (i e., when $V_o$ is equal to $V_o'$). Random offsets are caused by, among other things, differences between the electrical characteristics of a given output transistor M4, M6 and its corresponding replicating device M8a, M8b, respectively (FIG. 2).

Additionally shown in FIG. 3 is a cross current circuit 50. Circuit 50 is provided to finely tune or regulate the quiescent current through the output transistors M4, M6. That is, while use of replicating transistors M8a, M8b coarsely establishes a forward biasing quiescent current, cross current circuit 50 precisely controls such current. Moreover, this fine tuning of the quiescent current is achieved without degrading the frequency response of the amplifier 10, as will be described in conjunction with FIGS. 6–7. Cross current circuit 50 includes a sensor (here a sensor transistor M10) for sensing the current flow through the lower output transistor M6 and a circuit, coupled to a first drive transistor Q22 (FIG. 5) of floating driver portion 22a, for adjusting the gate signal $Vg_{M4}$ in response to the sensed current flow through the lower output transistor M6, as will be described. More particularly, the gate electrode of sensor transistor M10 is coupled to the gate electrode of transistor M6, so that a current proportional to that flowing through transistor M6 flows through transistor M10. Note however that preferably, sense transistor M10 has a significantly scaled down area from that of output transistor M6, such as by a factor of 600:1, so that the current flow through sense transistor M10 is sufficient for sensing purposes but does not dissipate unnecessary power. Additionally, the scale factor between the area of transistors M10 and M6 (such scale factor being referred to as T in conjunction with FIGS. 6–7) has an impact on the frequency response of amplifier 10, as will be described below. A transistor Q12 is coupled in series with sense transistor M10 and is biased by a transistor network 34, as shown. Transistor network 34 is comprised of transistors M14–M20, with transistor M14 and M16 biased by terminal H of driver portion 22b and transistors M18 and M20 biased by terminal L of driver portion 22b. Under ideal conditions, the current sunk by transistor M10 (i.e., passing through transistor Q12) is perfectly balanced by, or equal to, the current sourced by transistors M14, M18. If a random circuit offset causes the current through transistor M10 to exceed this balance, a net current is extracted from node K of driver portion 22a. This will slightly lower $Vg_{M4}$ thereby reducing the excessive current in transistor M6 caused by transistor M4. Alternately, if such random offest causes the current through transistors M14, M18 to be below this balance, a net current is sourced to node K of driver portion 22b which will increase the gate signal $Vg_{M4}$.

More specifically, driver portion 22a has a terminal K coupled to the collector electrode of transistor Q12. As will become apparent from the description of driver 22 in FIG. 5, terminal K is coupled to the base electrode of the first drive transistor Q22 of driver portion 22a, such transistor being that which provides the gate signal $Vg_{M4}$. Thus, terminal K has a high impedance characteristic associated therewith. More particularly, the gate signal $Vg_{M4}$ is established at the emitter electrode of the first drive transistor Q22. It is further noted that a capacitor C1 is coupled between terminal K of driver portion 22a and ground and a capacitor C4 is coupled between terminal K of driver portion 22b and the amplifier output $V_o$, as shown. Capacitors C1 and C4 are here provided for frequency compensation as will be discussed below.

When random offsets exist, current is drawn from the base electrode of drive transistor Q22, the effect of which is to reduce the gate signal $Vg_{M4}$ provided by driver portion 22a. In this way, the gate signal $Vg_{M4}$ is decreased so that less current flows therethrough, thereby reducing the current flow through the lower output transistor M6. Stated differently, an increase in the current flow through lower output transistor M6 causes a decrease in the voltage of the output signal $V_o$. The combination of diode D4 and transistor Q12 serves to maintain the drain voltage of transistor M10 essentially the same as that of transistor M6; thus transistor M10 accurately senses the current through transistor M6 since both the gate and drain voltages are similar.

Note that in the case where the source of excess quiescent current is external (i.e., such excess current being provided by circuitry connected to the $V_o$ terminal as opposed to flowing through upper output transistor M4), cross current circuit 50 has negligible effect. That is, while any such excess current flowing through the lower transistor M6 will be sensed by transistor M10, and the gate signal $Vg_{M4}$ decreased as described above, this will only maintain the already non-conducting state of the upper output transistor M4.

Figure 4:
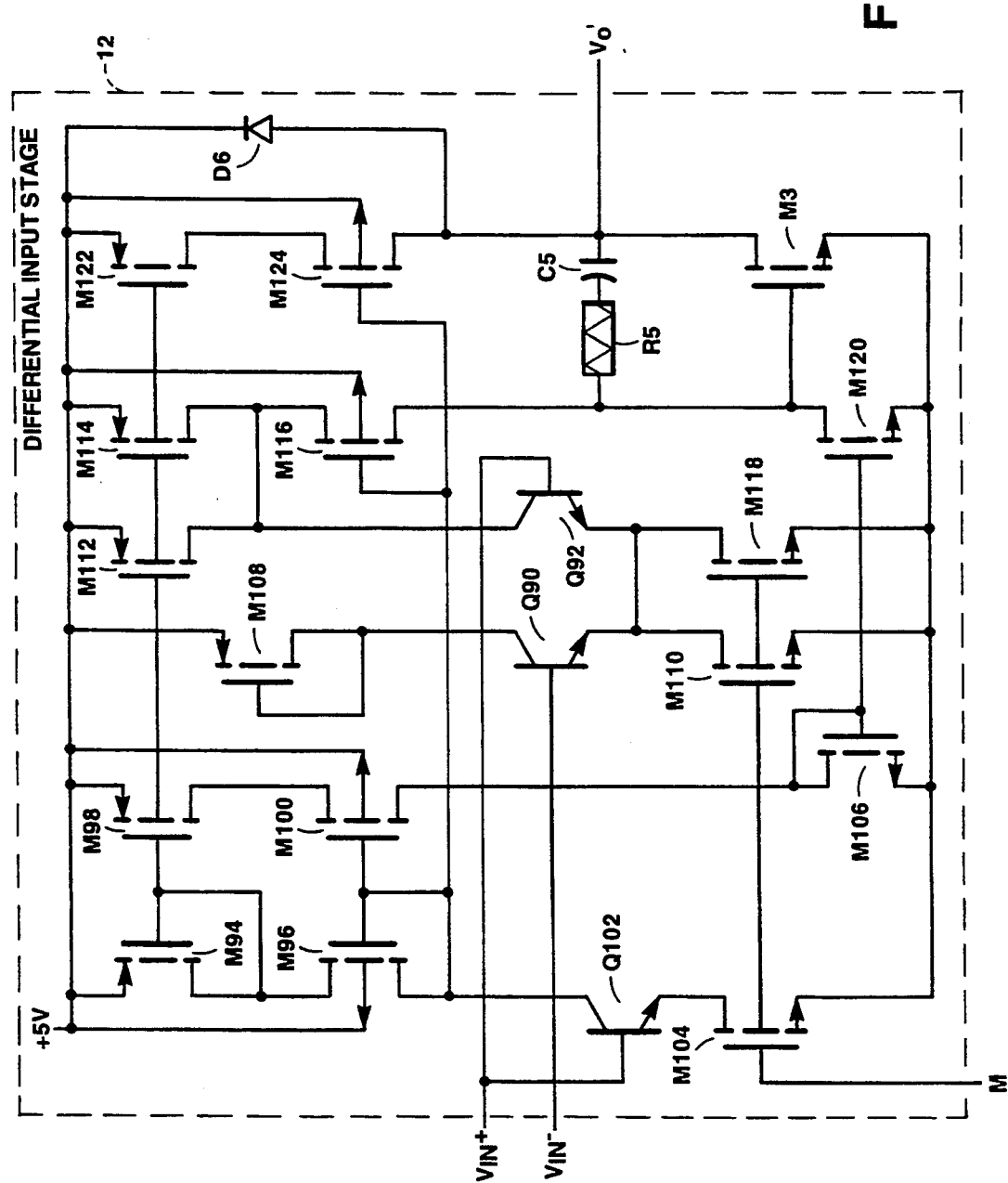
FIG. 4 is a detailed schematic of the input stage of the amplifier circuit of FIG. 3.

Referring now to FIG. 4, the input stage 12 will be described briefly Amplifier inputs $V_{IN}+$, $V_{IN}−$ are coupled to a conventional differential matched pair of transistors Q90, Q92, as shown. In accordance with the difference in the voltage levels of such input signals $V_{IN}+$, $V_{IN}−$, the voltage at the gate electrode of transistor M3 is determined. Note that transistor M3 provides the gain, as represented in FIGS. 2 and 3 by transistor M3. In this way, intermediate amplified signal $V_o'$ is provided at the drain electrode of transistor M3, as shown. Additional circuitry, including transistors M94–M124, is provided to establish bias operating points and current levels, as is conventional. Resistor R5 and capacitor C5 provide frequency compensation.

Referring now to FIG. 5, the driver circuit 22 will be described in greater detail generally and in conjunction with its configuration and operation as driver portions 22a, 22b of FIG. 2 and 3. Before discussing the detailed operation however, keep in mind the overall operation described above in conjunction with FIG. 2. Namely, the voltage across the replicating transistors M8a, M8b is summed with the buffer output signals from the corresponding buffer amplifier 30a, 30b by the corresponding summing circuit 32a, 32b, respectively. Thus, in quiescent operation (i.e., when $V_o$ is equal to $V_o'$), the gate signals $Vg_{M4}$, $Vg_{M6}$ are equal to the voltage across the corresponding replicating transistor M8a, M8b, respectively.

Turning now to driver circuit 22, a first circuit path including transistors M30, M32, Q34, and M36 provides an output path for a current mirror, the input current path of which is provided by transistors Q26 and M28 of FIG. 3. Additional current output paths are mirrored by transistors M38-M53, here arranged in cascoded pairs, to provide current sources of a current proportional to that flowing through the input current mirror path comprising transistors Q26 and M28 (FIG. 3). The inputs V+ and V− of driver circuit 22 are coupled to a matched transistor pair M54, M56, as is conventional. The current passing through transistors M54, M56 and series coupled transistors M58, M60, respectively, is mirrored by current mirrors 40, 42, to provide like currents through transistors M62, M64 and M66, M68, respectively. Note that a circuit path including transistors M46, M48, M70, and M72 establishes the biasing for current mirrors 40, 42.

The replicating devices M8a, M8b of FIG. 2 are provided by transistor M8 having interconnected drain and gate electrodes and a source electrode coupled to a circuit terminal R. The driver circuit 22 is configured to drive the upper output transistor M4 or the lower output transistor M6 in accordance with the connection of terminal R. That is, referring briefly back to FIG. 3, it is observed that in the case of driver portion 22a, terminal R and the positive input V+ are coupled together and further to the intermediate amplified signal $V_o'$; whereas in the driver portion 22b, terminal R is coupled to ground and the negative input V− is coupled to the intermediate amplified signal $V_o'$. In this way the coupling of the replicating devices M8a, M8b is as shown in FIG. 2 with replicating device M8a floating and M8b referenced to ground.

In operation, the voltage across the replicating transistors M8a, M8b is summed with the buffer signal provided by the corresponding one of buffer amplifiers 30a, 30b to provide the gate signals $Vg_{M4}$, $Vg_{M6}$ to the gate electrodes of the output transistors M4, M6, respectively. The way in which this summing is achieved will now be described. It is noted that regardless of whether the replicating device M8 is floating as is the case in driver portion 22a or is referenced to ground as is the case in driver portion 22b, the operation of driver 22 is the same. Referring then generally to FIG. 5, the voltage at the drain electrode of transistor M8 is one $V_{be}$ drop below that of a first terminal of a resistor R1. That is, the $V_{be}$ drop is provided by the base to emitter diode of transistor Q80. The base voltage of a transistor Q82, the emitter electrode of which is coupled to a second terminal of resistor R1, is 2 $V_{be}$ plus the voltage dropped across resistor R1 above the voltage at the drain of transistor M8, with the second $V_{be}$ provided by the base to emitter junction of transistor Q82. Here, resistors R1 and R2 are each seventy kohms and have equal voltage drops when V+ equals V−. Ideally, transistor Q84 is matched to transistor Q82 and transistor Q22 is ratio matched to transistor Q80. Thus, it becomes apparent that the voltage at the emitter electrode of transistor Q22 (i.e., the gate signals $Vg_{M4}$, $Vg_{M6}$) is equal to the voltage at the drain of replicating transistor M8. In this way, when the inputs V−, V+ of driver circuit 22 are equal (i.e., $V_o$ and $V_o'$ are equal), the gate signal $Vg_{M4}$ or $Vg_{M6}$ provided at the emitter electrode of transistor Q22 is equal to the voltage across the diode connected replicating device M8. Stated differently, the gate signal provided at the emitter electrode of transistor Q22 matches the voltage at the drain electrode of the replica transistor M8 when the inputs $V_o$ and $V_o'$ of the buffer amplifier driver 22 are equal because there is no net voltage drop across the circuit path comprising Q80, R1, Q82, Q84, R2, and Q22.

Whereas, when the inputs V−, V+ are unequal, the gate signal $Vg_{M4}$, $Vg_{M6}$ provided at the emitter electrode of transistor Q22 is equal to the sum of a buffer signal and the voltage across the replicating transistor M8 The buffer signal is equal to $A(V_o-V_o')$ in the case of buffer amplifier 30a (FIG. 2) or $A(V_o-V_o')$ in the case of buffer amplifier 30b, where A is the gain of the buffer amplifier 30a, 30b. For example, in the case where the V+ input of driver 22 is greater than the V− input, less current flows through the differential path including transistors M56 and M60 than the path including M54 and M58. Likewise, less current will flow through the output current path of current mirror 42 than through the output current path of current mirror 40. Or stated differently, less current will flow through the circuit path including transistors Q84, Q88, M66, M68 and resistor R2 than through the path including transistors Q82, Q86, M62, M64 and resistor R1. Thus, a decreased voltage drop is developed across resistor R2 and an increased voltage drop is developed across resistor R1, causing the voltage at the base electrode of drive transistor Q22 to increase and thus also the gate signal $Vg_{M4}$, $Vg_{M6}$ to increase.

On the other hand, when V+ is less than V−, less current flows through the circuit path including resistor R1 than that including resistor R2. This current causes a decreased voltage drop to develop across resistor R1 while the drop across resistor R2 increases. The result then is a decrease in the voltage at the base electrode of drive transistor Q22, or a decrease in the voltage level of the gate signal $Vg_{M4}$, $Vg_{M6}$.

Referring briefly back to the cross current circuit 50 of FIG. 3, it should now be apparent how an "imbalance" between the sensed current flow through transistor M10 and the current sourced through transistors M14, M18 affects the gate signal $Vg_{M4}$ provided at the emitter of transistor Q22. This "imbalance" results in current either being sourced to R2 raising the base voltage of transistor Q22, thereby increasing the gate signal $Vg_{M4}$, or extracted from R2 raising the base voltage of transistor Q22, thereby decreasing the gate signal $Vg_{M4}$. As described above, in the case where random offsets exist causing greater than desired quiescent current flow through output transistor M6, more current is sunk through transistor M10 than is sourced by transistors M14, M18. In this case, the additional current flow through transistor M10 is extracted from R2, causing the gate signal $Vg_{M4}$ to decrease. On the other hand, when random offsets exist causing less than desired quiescent current flow through output transistor M6, less current is sunk though transistor M10 than is sourced by transistors M14, M18. In this case, the additional current sourced by transistors M14, M18 will be sourced to R2, causing the gate signal $Vg_{M4}$ to increase.

It is noted that while other techniques for driving the lower, NMOS output transistor of a push-pull amplifier circuit, such as transistor M6 of the present amplifier 10, are known, the present arrangement of is desirable since it facilitates circuit fabrication. That is, since driver portions 22a, 22b, are provided by the same driver circuit 22 of FIG. 5, fabrication is a matter of duplicating the driver 22 and appropriately connecting terminal R thereof, thereby eliminating the need for different driver circuits to provide driver portions 22a, 22b. That is, by duplicating the fabrication of a single driver circuit 22, the simplicity of the amplifier fabrication is enhanced.

It is noted that the transistors 74 are provided and arranged to cancel out, or compensate the base current of drive transistor Q22. More particularly, the arrangement of transistors 74 causes the net base current load of transistors Q80 and Q22 on R1 and R2, respectively, to be equal, as is desirable to ensure that in quiescent operation, the voltage at the emitter of transistor Q22 is equal to the voltage across the replicating transistor M8. It is appropriate to note that here the current sources 13a, 13b of FIG. 2 are representative of a current source provided by transistors M38, M40 (FIG. 5). It is further noted that an additional current source is added to transistor M3 (FIG. 4) by transistors M122 and M124 of FIG. 4 to enhance the transconductance of M3. Referring briefly back to FIG. 3, it is observed that terminals Q and M of the driver portions 22a, 22b are interconnected. From the above discussion of FIG. 5, it is apparent that such terminals Q, M are bias points or nodes. The benefit of interconnecting such bias points of the upper and lower driver portions 22a, 22b, respectively, is to reduce the random offsets occuring therebetween.

Figure 6A:
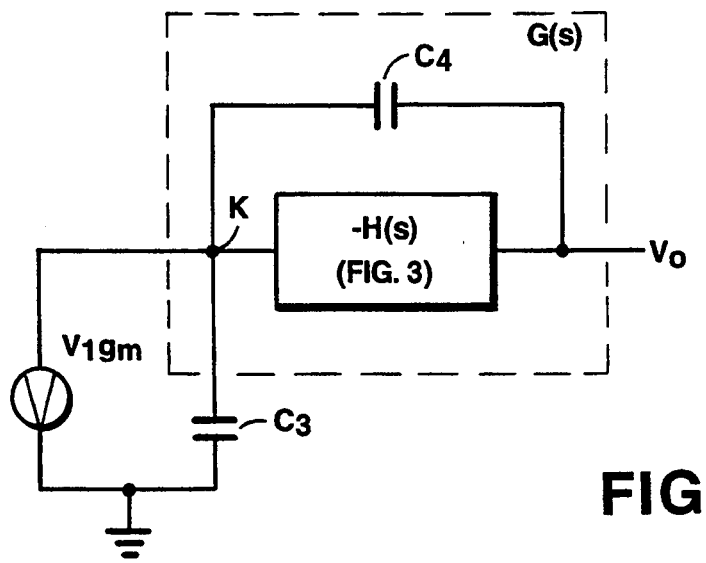
FIG. 6A is a system model representation of the amplifier circuit of FIG. 3.

Referring now to FIG. 6A, the frequency response of the amplifier 10, and in particular the effect of the cross current circuit thereon, will be described in conjunction with a model of the amplifier 10 having an arbitrary transfer function H(s) embedded therein. As is apparent from the schematic of FIG. 3, here the cross current feedback circuit 50 is embedded in the pole split loop of the ground referenced driver portion 22b. This embedded coupling of cross current feedback circuit 50 overcomes potential stability limitations resulting from use of such a circuit, as will be shown. Here the transfer function H(s) represents the cross current circuit 50 in combination with the floating driver portion 22a, such transfer function H(s) being shown blocked off in FIG. 3. The transfer function labelled G(s) results from coupling the pole split capacitor C4 of the second driver portion 22b around the transfer function H(S). That is, as shown in FIG. 3, capacitor C4 is coupled between terminal K of driver portion 22b and the amplifier output $V_o$. Capacitor C3 of FIG. 6A represents the loading at terminal K of driver portion 22b which is substantially capacitive. The voltage controlled current source $V_1 g_m$ represents the input stage 12 of the amplifier 10, with $V_1$ being a single ended input voltage (for example, as would be the case where $V_o'$ is at AC ground and the loop is opened up at the V+ input of driver 22b).

Figure 6B:
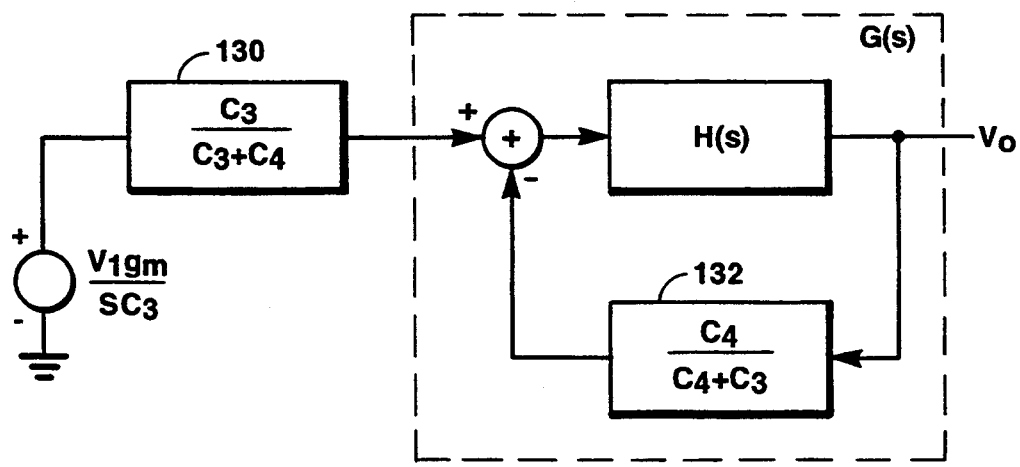
FIG. 6B is an equivalent system model to that of FIG. 6A.
Figure 6C:
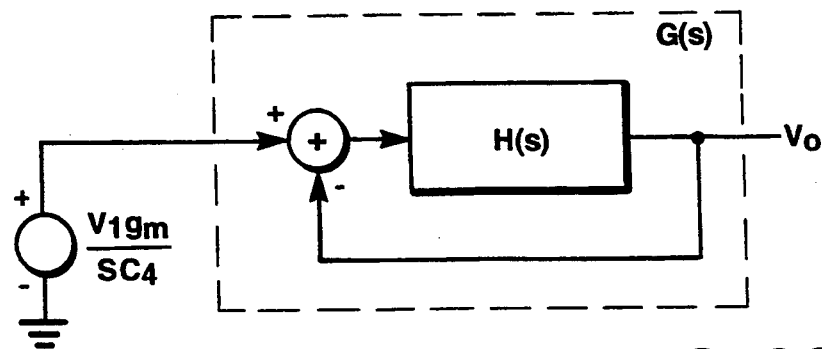
FIG. 6C is an equivalent system model to that of FIG. 6B.

Manipulation of the model of FIG. 6A, such as by taking the Thevenin equivalent, yields the model of FIG. 6B. The model of FIG. 6B can be further simplified by assuming that capacitor C4 is significantly larger than C3. The result is that circuit block 132 (FIG. 6B) approaches unity, thus providing the unity feedback arrangement of FIG. 6C. Additionally, further simplification of FIG. 6B results from multiplying the transfer function of the load $V_1 g_m /SC3$ by circuit block 130 to yield the load transfer function $V_1 g_m /SC4$ of FIG. 6C.

The resulting closed loop pole/zero locations are determined by "nesting" G(s) within an integrator feedback loop or, in terms of FIG. 3, by coupling the amplifier output $V_o$ to the positive input V+ of the second driver portion 22b. The integrator is used to approximate the gain stage of the second driver portion 22b, with $g_{m1}$ corresponding to the transconductance of one of the PMOS input devices, such as transistors M54, M56 (FIG. 5) here such transconductance $g_{m1}$ being approximately 180 μmho. With this arrangement, the closed loop pole and zero locations are given by the following equations:

$$P_g = \frac{-TR_g g_m + A_v + 2}{2CR_g} = 8 \text{ MHz} \quad (1)$$

$$Z_g = \frac{-TR_g g_m + 1}{CR_g} = 4 \text{ MHz} \quad (2)$$

The transconductance of the output transistors M4, M6 is represented by $g_m$ and here is 0.028 mho. Capacitance C is equal to the compensation capacitance of capacitors C1, C4 in FIG. 3, here each having a value of 2.5 picofarads. Note, however, that while capacitors C1, C4 are equal to each other and to the value C for purposes of equations (1), (2), such capacitors C1, C4 may alternatively have unequal values. Resistance $R_g$ is equal to resistors R1, R2 of FIG. 5, here seventy kilohms and $A_v$ is equal to $g_{m1} R_g$. Scale factor T is the ratio of the area of sense transistor M10 to that of lower output transistor M6. This ratio is proportional to a cross current feedback coefficient.

More particularly, the cross current feedback coefficient is related to the sensitivity of the cross current circuit 50 in that such coefficient determines the extent to which the gate signal $V_{gM4}$ is adjusted in response to a given change in the current sensed by transistor M10. The feedback coefficient is selected to provide an acceptable variation in the quiescent current flow through the output transistors M4, M6 in response to the variation in the quiescent current caused by random circuit offsets. Here, such coefficient provides a loop gain of 1.66; however, it has been found that coefficients providing a loop gain as large as sixteen can be used without causing undesirable oscillations.

More particularly, by embedding the cross current feedback circuit 50 within the pole split loop of the lower driver portion 22b as shown in FIG. 3, the AC characteristics of the amplifier 10 are not degraded by the use of the cross current circuit. Note that certain simplifications have been made in arriving at the transfer function H(s), such as neglecting the effect of an inductive and resistive load coupled to $V_o$, as is possible since the frequency effects of such a load are negligible below the closed loop gain-bandwidth of the amplifier 10.

Figure 1:
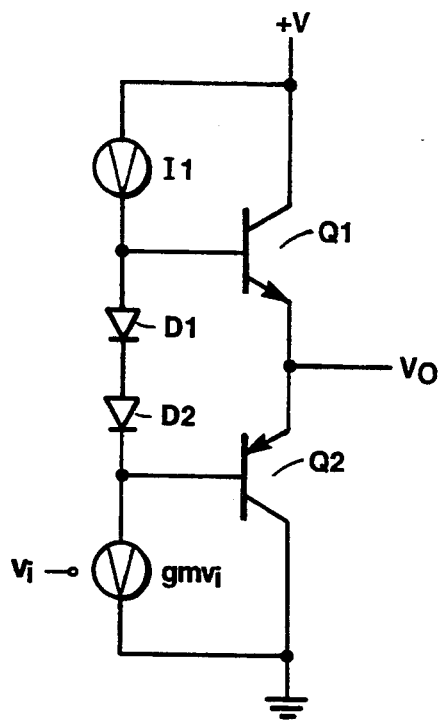
FIG. 1 is a schematic of a prior art bipolar emitter-follower quiescent biasing circuit.
Figure 7:
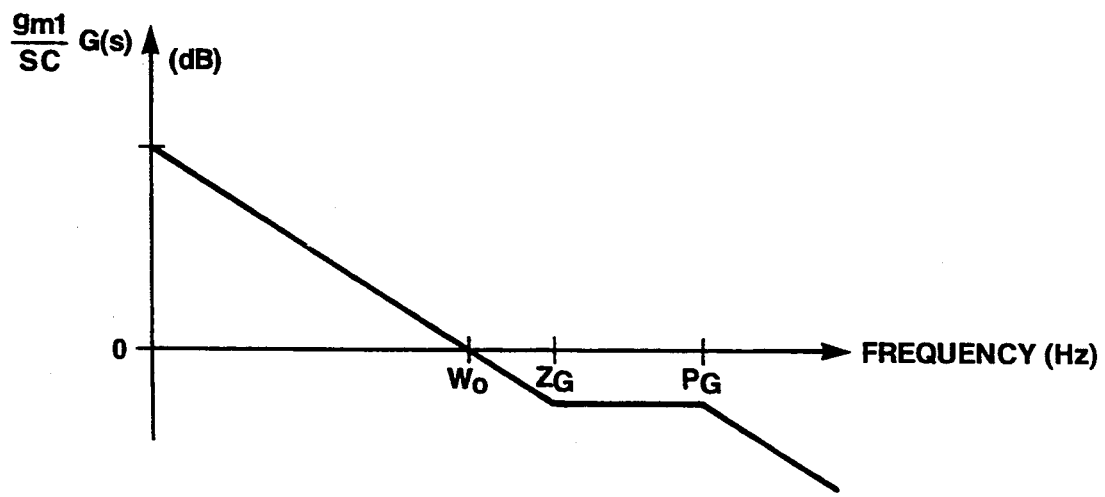
FIG. 7 is a Bode plot of the closed loop frequency response of the amplifier of FIG. 3.

The resulting closed loop response of the amplifier 10 is shown in FIG. 7. It is noted that the unity gain frequency is given by:

$$\frac{g_{m1}}{C} \cdot \frac{TR_g g_m + 1}{TR_g g_m + A_v + 2} = 2.7 \text{ MHz} \quad (3)$$

The unity gain frequency of 2.7 MHz is well below $|P_g|$ and $|Z_g|$ on the Bode plot, thus indicating stability. In the present case:, T is set to 0.0017 corresponding to a feedback coefficient of 1.66 and the frequency of $|Z_g|$ is less than $|P_g|$. As T is increased, $|Z_g|$ passes $|P_g|$ in frequency. This arrangement would result in a −40 dB/decade slope of the frequency response for a time. However, for the particular values of $R_g$, $g_m$, and $g_{m1}$ used in the present amplifier 10, for an arbitrarily large value of T, $|P_g|$ will always be greater than the crossover frequency. Thus, since $|P_g|$ is greater than the crossover frequency, any such −40 dB/decade slope occurs after the zero crossing, thereby ensuring stability.

Having described the preferred embodiments of the invention, it will now become apparent to one of skill in the art that other embodiments incorporating their concepts may be used. It is felt therefore that these embodiments should not be limited to disclosed embodiments but rather should be limited only by the spirit and scope of the appended claims.

I claim:

1. An amplifier circuit comprising:
   an input differential amplifier stage, for receiving an input signal, and for providing an intermediate amplified signal in response to said input signal;
   an output stage comprising a pair of output transistors, each of said transistors having a gate electrode, a drain electrode, and a source electrode, and a quiescent current associated therewith, wherein the source electrode of an upper one of said pair of output transistors is coupled to the drain electrode of a lower one of said pair of output transistors, and wherein an amplifier output signal, responsive to said intermediate amplified signal, is provided at the source electrode of said upper one of said pair of output transistors; and
   a driver stage, coupled between said input differential amplifier stage and said output stage, comprising a first driver portion having a first drive transistor for providing a gate signal to the gate electrode of said upper one of said pair of output transistors and a second driver portion having a second drive transistor for providing a gate signal to the gate electrode of said lower one of said pair of output transistors, wherein each of said first driver portion and said second driver portion comprises a replicating device having a current therethrough and having electrical characteristics substantially similar to the corresponding one of the pair of output transistors so that said quiescent current through each of the output transistors is proportional to said current through the corresponding replicating device.

2. The amplifier circuit recited in claim 1 wherein the replicating device of said first driver portion is coupled to said intermediate amplified signal.

3. The amplifier circuit recited in claim 2 wherein each of said replicating devices of said first and second driver portions is a MOS transistor having interconnected drain and gate electrodes.

4. The amplifier circuit recited in claim 3 wherein each of said first driver portion and said second driver portion comprises a buffer amplifier fed by said intermediate amplified signal for providing a buffer signal to the gate electrode of the corresponding one of the pair of output transistors.

5. The amplifier circuit recited in claim 4 wherein each of said first driver portion and said second driver portion further comprises a summing circuit for summing the voltage across the corresponding one of the replicating devices with the buffer signal of the corresponding one of the buffer amplifiers to provide said gate signals.

6. An amplifier circuit comprising:
   an input differential amplifier stage, for receiving an input signal, and for providing an intermediate amplified signal in response to said input signal;
   an output stage comprising a pair of output transistors, each of said transistors having a gate electrode, a drain electrode, and a source electrode, and a quiescent current associated therewith, wherein the source electrode of an upper one of said pair of output transistors is coupled to the drain electrode of a lower one of said pair of output transistors, and wherein an amplifier output signal, responsive to said intermediate amplified signal, is provided at the source electrode of said upper one of said pair of output transistors;
   a driver stage, coupled between said input differential amplifier stage and said output stage, comprising a first driver portion having a first drive transistor for providing a gate signal to the gate electrode of said upper one of said pair of output transistors and a second driver portion having a second drive transistor for providing a gate signal to the gate electrode of said lower one of said pair of output transistors, wherein each of said first driver portion and said second driver portion comprises a replicating device having a current therethrough and having electrical characteristics substantially similar to the corresponding one of the pair of output transistors so that said quiescent current through each of the output transistors is proportional to said current through the corresponding replicating device; and
   a cross current feedback circuit for regulating the quiescent current flow through each of said pair of output transistors, said cross current circuit comprising a sensor for sensing a current flow through said lower output transistor and a circuit, coupled to said first drive transistor, for adjusting the gate signal provided by said first drive transistor to the gate electrode of the upper output transistor in response to the sensed current flow through the lower output transistor.

7. A driver circuit for driving a source follower output transistor of a push-pull amplifier, said transistor being coupled to a positive supply voltage, said amplifier having an input stage for receiving an input signal and for providing an intermediate amplified signal, and an output stage, including said source follower output transistor, for providing an amplifier output signal in response to said input signal, said driver circuit comprising:
   a replicating transistor having electrical characteristics substantially similar to those of said source follower output transistor;
   a buffer amplifier having a first input coupled to said intermediate amplified signal, a second input coupled to said amplifier output signal, and an output providing a buffer signal; and
   a summing circuit, coupled to said output of said buffer amplifier and said replicating transistor, for summing the voltage across said replicating transistor with said buffer signal to provide a gate signal to a gate electrode of said source follower output transistor.

8. The driver circuit recited in claim 7 wherein said replicating transistor has a drain electrode, a gate electrode, and a source electrode and wherein said drain electrode and said gate electrode are interconnected and said summing circuit is coupled to said drain electrode of said replicating transistor.

9. The driver circuit recited in claim 8 wherein said source electrode of said replicating transistor is coupled to said intermediate amplified signal.

10. An amplifier circuit comprising:
an input differential amplifier stage, for receiving an input signal, and for providing an intermediate amplified signal in response to said input signal;
a pair of NMOS output transistors, each of said transistors having a gate electrode, a drain electrode, and a source electrode, and a quiescent current associated therewith, wherein the source electrode of an upper one of said pair of output transistors is coupled to the drain electrode of a lower one of said pair of output transistors, and wherein an amplifier output signal, responsive to said intermediate amplified signal, is provided at the source electrode of said upper one of said pair of transistors;
a driver stage, coupled between said input differential amplifier stage and said output stage, comprising a first driver portion having a first drive transistor for providing a gate signal to the gate electrode of said upper one of said pair of output transistors and a second driver portion having a second drive transistor for providing a gate signal to the gate electrode of said lower one of said pair of output transistors, wherein each of said first driver portion and said second driver portion comprises a replicating device having a current therethrough and having electrical characteristics substantially similar to the corresponding one of the pair of output transistors so that said quiescent current through each of the output transistors is proportional to said current through the corresponding replicating device; and
a cross current feedback circuit comprising:
(a) a sensor for sensing a current flow through said lower output transistor; and
(b) a circuit, coupled to said first drive transistor, for adjusting the gate signal provided to the gate electrode of the upper output transistor in response to the sensed current flow through the lower output transistor.

11. The amplifier circuit recited in claim 10 wherein said sensor comprises a sense transistor having a gate electrode coupled to the gate electrode of said lower output transistor, wherein said sense transistor conducts a current proportional to said current flow through said lower output transistor.

12. The amplifier circuit recited in claim 11 wherein the replicating device of said first driver portion is coupled to said intermediate amplified signal.

13. The amplifier circuit recited in claim 10 wherein each of said replicating devices of said first and second driver portions is a MOS transistor having interconnected drain and gate electrodes.

14. A driver circuit for driving a source follower output transistor of a push-pull amplifier, said transistor being coupled to a positive supply voltage, said amplifier having an input stage for receiving an input signal and for providing an intermediate amplified signal, and an output stage, including said source follower output transistor, for providing an amplifier output signal in response to said input signal, said driver circuit comprising:

a replicating device having electrical characteristics substantially similar to those of said source follower output transistor;
a buffer amplifier having a first input coupled to said intermediate amplified signal, a second input coupled to said amplifier output signal, and an output providing a buffer signal; and
a summing circuit, coupled to said output of said buffer amplifier and said replicating transistor, for summing the voltage across said replicating device with said buffer signal to provide a gate signal to a gate electrode of said source follower output transistor.

15. The driver circuit recited in claim 14 wherein said replicating device is a MOS transistor having a drain electrode, a gate electrode, and a source electrode, wherein said drain and gate electrodes are interconnected.

16. The driver circuit recited in claim 15 wherein said source electrode of said replicating device is coupled to said intermediate amplified signal.

17. An amplifier circuit comprising:
an input differential amplifier stage for providing an intermediate amplified signal in response to an input signal;
an output stage comprising a pair of output transistors, each of said transistors having a gate electrode, a drain electrode, and a source electrode, and a quiescent current associated therewith, wherein the source electrode of an upper one of said pair of output transistors is coupled to the drain electrode of a lower one of said pair of output transistors, and wherein an amplifier output signal, responsive to said intermediate amplified signal, is provided at the source electrode of said upper one of said pair of output transistors; and
a driver stage, coupled between said input differential amplifier stage and said output stage, comprising a first driver portion for providing a gate signal to the gate electrode of said upper one of said pair of output transistors and a second driver portion for providing a gate signal to the gate electrode of said lower one of said pair of output transistors, wherein each of said first driver portion and said second driver portion comprises a replicating transistor having a current therethrough and having electrical characteristics substantially similar to the corresponding one of the pair of output transistors so that said quiescent current and said current through the corresponding replicating transistor are related by the ratio of the gate size of the output transistor to the gate size of the corresponding replicating transistor.

18. An amplifier circuit comprising:
an input differential amplifier stage, for receiving an input signal, and for providing an intermediate amplified signal in response to said input signal;
an output stage comprising a pair of output transistors, each of said output transistors having a gate electrode, a drain electrode, and a source electrode, wherein the source electrode of an upper one of said pair of output transistors is coupled to the drain electrode of a lower one of said pair of output transistors, and wherein an amplifier output signal, responsive to said intermediate amplified signal, is provided at the source electrode of said upper one of said pair of output transistors;

a driver stage, coupled between said input differential amplifier stage and said output stage, comprising a first driver portion having a first drive transistor for providing a gate signal to the gate electrode of said upper one of said pair of output transistors and a second driver portion having a second drive transistor for providing a gate signal to the gate electrode of said lower one of said pair of output transistors, wherein each of said first driver portion and said second driver portion comprises a replicating device having electrical characteristics substantially similar to the corresponding one of the pair of output transistors and wherein said gate signals are related to the voltage across the corresponding replicating device and wherein the replicating device of said first driver portion is coupled to said intermediate amplified signal and wherein each of said replicating devices of said first and second driver portions is a MOS transistor having an interconnected drain and gate electrodes, each of said first driver portion and said second driver portion further comprising:

(a) a buffer amplifier fed by said intermediate amplified signal for providing a buffer signal to the gate electrode of the corresponding one of the pair of output transistors; and (b) a summing circuit for summing the voltage across the corresponding one of the replicating devices with the buffer signal of the corresponding one of the buffer amplifiers to provide said gate signals; and a cross current feedback circuit for regulating the quiescent current flow through each of said pair of output transistors, said cross current circuit comprising a sensor for sensing the current flow through said lower output transistor and a circuit, coupled to said first drive transistor for adjusting the gate signal provided by said first drive transistor to the gate electrode of the upper output transistor in response to the sensed current flow through the lower transistor.

* * * * *